(12) United States Patent
Lin et al.

(10) Patent No.: US 6,975,170 B2
(45) Date of Patent: Dec. 13, 2005

(54) ADAPTIVE AMPLIFIER OUTPUT COMMON MODE VOLTAGE ADJUSTMENT

(75) Inventors: Heng-Chih Lin, Plano, TX (US); Ranjit Gharpurey, Ann Arbor, MI (US)

(73) Assignee: Texas Instruments Incorporated, Dallas, TX (US)

( * ) Notice: Subject to any disclaimer, the term of this patent is extended or adjusted under 35 U.S.C. 154(b) by 101 days.

(21) Appl. No.: 10/806,962

(22) Filed: Mar. 23, 2004

(65) Prior Publication Data

US 2005/0212599 A1 Sep. 29, 2005

(51) Int. Cl.$^7$ ................................................ H03F 3/45
(52) U.S. Cl. ..................... 330/258; 330/260; 330/255
(58) Field of Search .............................. 330/258, 260, 330/255

(56) References Cited

U.S. PATENT DOCUMENTS

| | | | | |
|---|---|---|---|---|
| 4,105,942 A | * | 8/1978 | Henry | 330/261 |
| 5,361,042 A | * | 11/1994 | Gist | 330/261 |
| 6,034,551 A | * | 3/2000 | Bridgewater, Jr. | 326/82 |
| 6,081,162 A | * | 6/2000 | Johnson | 330/301 |
| 6,229,273 B1 | * | 5/2001 | Kelly et al. | 318/254 |
| 6,429,700 B1 | * | 8/2002 | Yang | 327/108 |

* cited by examiner

*Primary Examiner*—Patricia Nguyen
(74) *Attorney, Agent, or Firm*—Alan K. Stewart; W. James Brady, III; Frederick J. Telecky, Jr.

(57) ABSTRACT

The circuit with adaptive amplifier output common mode voltage adjustment includes: a differential pre-amplifier; a re-generated comparator having a differential input coupled to a differential output of the pre-amplifier; and a replica comparator coupled to a common mode node of the pre-amplifier for adjusting a common mode of the pre-amplifier. The replica comparator provides a trip-point reference to set the output common mode of the pre-amplifier. This sets the output common mode of the pre-amplifier to the most sensitive region of the re-generated comparator.

11 Claims, 2 Drawing Sheets

ADAPTIVE AMPLIFIER OUTPUT COMMON MODE VOLTAGE ADJUSTMENT

FIELD OF THE INVENTION

The present invention relates to electronic circuitry and, in particular, to adaptive amplifier output common mode voltage adjustment.

BACKGROUND OF THE INVENTION

High speed signal comparison is widely used in many applications, i.e., high speed datacom receivers and high speed flash A/D converters. In those applications, the comparison is usually done by concatenating the pre-amplifier to amplify the input signal and the high-gain re-generated comparator to provide the final decision. The comparator speed is a function of both the signal swing and the comparator input common mode voltage.

Some prior art devices increase the pre-amplifier's gain at the cost of lowering the amplifier's speed. Other prior art devices increase the sizes of the amplifier and comparator to reduce the offset, but this burns more power.

SUMMARY OF THE INVENTION

A circuit with adaptive amplifier output common mode voltage adjustment includes: a differential pre-amplifier; a re-generated comparator having a differential input coupled to a differential output of the pre-amplifier; and a replica comparator coupled to a common mode node of the pre-amplifier for adjusting a common mode of the pre-amplifier. The replica comparator provides a trip-point reference to set the output common mode of the pre-amplifier. This sets the output common mode of the pre-amplifier to the most sensitive region of the re-generated comparator.

DETAILED DESCRIPTION OF PREFERRED EMBODIMENTS

The present invention increases the signal comparison speed which is very important to many applications, e.g., high speed datacom receivers and high speed flash A/D converters. In those applications, the comparison is usually done by concatenating the pre-amplifier to amplify the input signal and the high-gain re-generated comparator to provide the final decision. The comparator speed is a function of both the input signal swing and the common mode voltage. By using a comparator replica circuit as a trip-point voltage reference, the present invention adaptively tracks the process, voltage, and temperature variation, and adjusts the output common mode voltage of the pre-amplifier (or input common mode voltage to the comparator) accordingly to the trip-point of the re-generated comparator, thus achieving high speed signal comparison.

Figure 1:
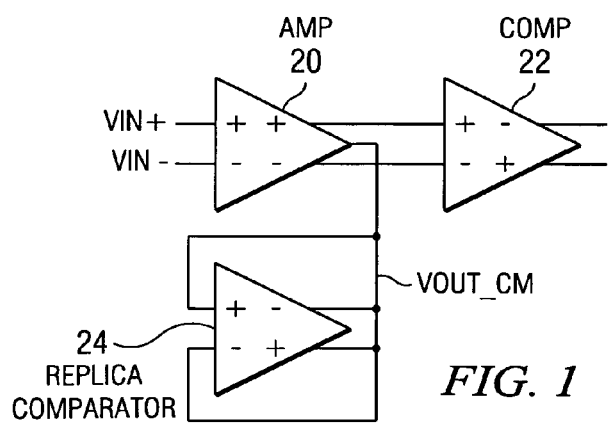
FIG. 1 is a block diagram of a preferred embodiment circuit with adaptive amplifier output common mode voltage adjustment.

FIG. 1 shows a block diagram of a preferred embodiment device. The signal comparison is done by first amplifying the signal Vin+ and Vin− through the pre-amplifier 20, then latching the signal through the high gain, re-generated comparator 22. The replica comparator 24, configured in unity-gain feedback fashion in this example, is used to provide the trip-point (or optimized) reference to set the output common mode Vout_CM of the pre-amplifier 20. This sets the output common mode of the pre-amplifier 20 to the most sensitive region of the comparator, thus achieving the high speed signal comparison.

Figure 2:
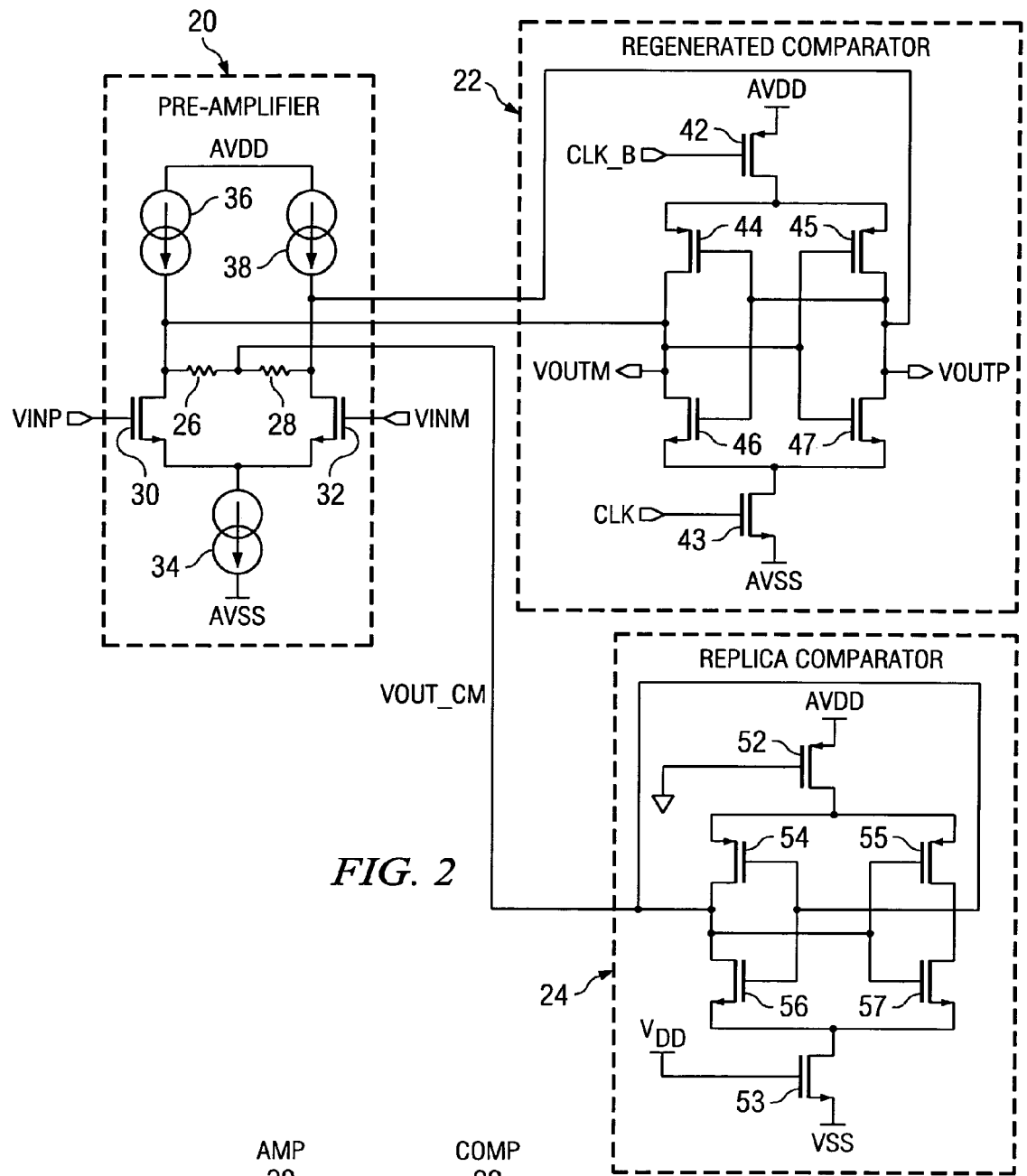
FIG. 2 is a circuit diagram of an example implementation of the device of FIG. 1.

FIG. 2 elaborates this idea by providing one circuit example of the device of FIG. 1. The circuit of FIG. 2 includes pre-amplifier 20 which includes resistors 26 and 28, transistors 30 and 32, current sources 34, 36, and 38, inputs VINP and VINM, source voltage nodes AVDD and AVSS, and common mode node VOUT_CM; re-generated comparator 22 which includes transistors 42–47, output nodes VOUTP and VOUTM, source voltage nodes AVDD and AVSS, and clocking inputs CLK and CLK_B; and replica comparator 24 which includes transistors 52–57, source voltage nodes AVDD and AVSS, and bias nodes gnd and vdd.

The simplest fully differential amplifier 20 plus a clocked CMOS cross coupling latch 22 (comparator) is used in the circuit of FIG. 2. Replica comparator 24 provides the comparator trip-point reference to set the output common mode of the pre-amplifier 20. This setting is through the simple resistive common mode feedback formed by resistors 26 and 28 in this example. The common mode feedback can be done in many other fashions as is well known in the art. With a different comparator circuit, the reference voltage might be different. However, the goal is to set the pre-amplifier's output common mode voltage to the most sensitive region of that particular comparator. When process, voltage, and temperature vary, the trip-point of the comparator 22 might change. However, since a replica comparator 24 is used, the trip-point reference adaptively changes as well to provide an accurate trip-point in any process, voltage, temperature variation.

Figure 3:
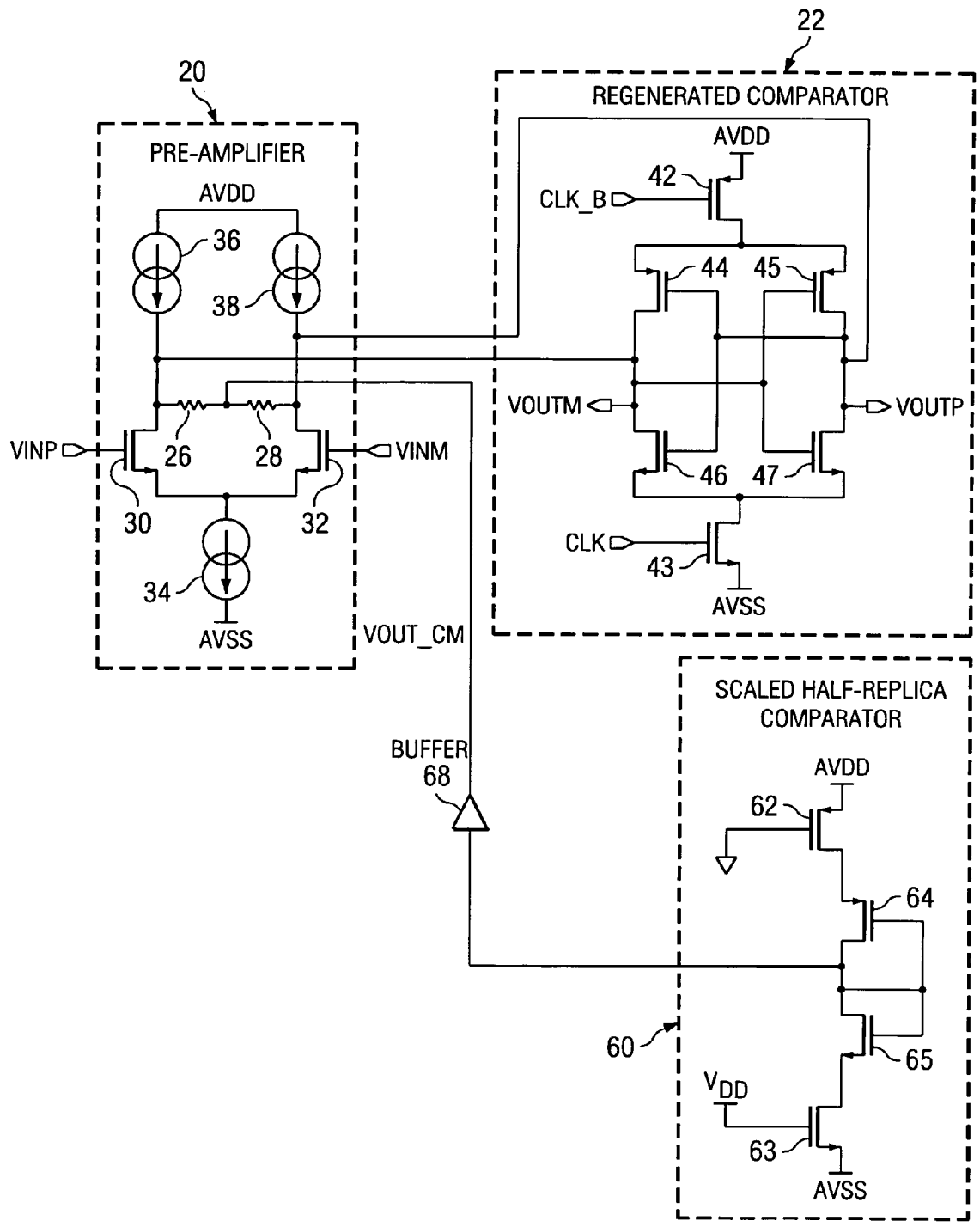
FIG. 3 is a circuit diagram of an example implementation of the device of FIG. 1 using a half-replica comparator.

FIG. 3 shows a power/area efficiency version of the circuit of FIG. 2. The difference between the circuits of FIG. 3 and FIG. 2 is that only a half replica comparator 60 is used to generate the trip-point reference in FIG. 3. The pre-amplifier 20 and re-generated comparator 24 are the same as in FIG. 2. The half replica comparator includes transistors 62–65, source voltage nodes AVDD and AVSS, and bias nodes gnd and vdd. The components of the replica comparator 60 do not need to be the same size as those of the regenerated comparator 22. They can be scaled versions to save power/area. If the driving capability is a concern, a buffer stage 68 can be added as well.

By using a comparator replica circuit to generate an optimized reference, the present invention adaptively tracks the process, voltage, and temperature variation, and adjusts accordingly the output common mode voltage of the pre-amplifier (or input common mode voltage to the comparator) at the optimized common mode voltage of the re-generated comparator, thus achieving a much higher comparison speed.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description.

It is therefore intended that the appended claims encompass any such modifications or embodiments.

What is claimed is:

1. A circuit with adaptive amplifier output common mode voltage adjustment comprising:
   a differential pre-amplifier;
   a re-generated comparator having a differential input coupled to a differential output of the pre-amplifier; and
   a replica comparator coupled to a common mode node of the pre-amplifier for adjusting a common mode of the pre-amplifier.

2. The circuit of claim 1 wherein the replica comparator is an equivalent circuit to the re-generated comparator.

3. The circuit of claim 1 wherein the replica comparator is a scaled version of the re-generated comparator.

4. The circuit of claim 1 wherein the replica comparator is a scaled half-replica of the re-generated comparator.

5. The circuit of claim 1 wherein the re-generated comparator is a CMOS cross coupling latch.

6. The circuit of claim 5 wherein the replica comparator is a CMOS cross coupling latch.

7. The circuit of claim 5 wherein the replica comparator is a half CMOS cross coupling latch.

8. The circuit of claim 7 further comprising a buffer coupled between the replica comparator and the pre-amplifier.

9. The circuit of claim 1 wherein the pre-amplifier has a resistive common mode feedback.

10. A method for adaptively adjusting an output common mode voltage of an amplifier comprising:
    coupling an output of a pre-amplifier circuit to an input of a re-generated comparator;
    adjusting a common mode voltage of the pre-amplifier such that an output common mode voltage of the pre-amplifier is at the optimized common mode voltage of the re-generated comparator; and
    wherein the step of adjusting the common mode voltage of the pre-amplifier comprises coupling an output of a replica comparator to a common mode node of the pre-amplifier, wherein the replica comparator is a replica of the re-generated comparator.

11. A method for adaptively adjusting an output common mode voltage of an amplifier comprising:
    coupling an output of a pre-amplifier circuit to an input of a re-generated comparator;
    adjusting a common mode voltage of the pre-amplifier such that an output common mode voltage of the pre-amplifier is at the optimized common mode voltage of the re-generated comparator; and
    wherein the step of adjusting the common mode voltage of the pre-amplifier comprises coupling an output of a half-replica comparator to a common mode node of the preamplifier, wherein the half-replica comparator is a half-replica of the re-generated comparator.

* * * * *